United States Patent [19]

Sumi

[11] 4,063,103

[45] Dec. 13, 1977

[54] ELECTRON BEAM EXPOSURE APPARATUS

[75] Inventor: Masahiko Sumi, Yokohama, Japan

[73] Assignee: Tokyo Shibaura Electric Co., Ltd., Kawasaki, Japan

[21] Appl. No.: 675,170

[22] Filed: Apr. 8, 1976

[30] Foreign Application Priority Data

Apr. 11, 1975 Japan .................................. 50-43332
Dec. 10, 1975 Japan ............................... 50-146287
Dec. 26, 1975 Japan ............................... 50-154767

[51] Int. Cl.² ............................................. H01J 37/26
[52] U.S. Cl. ............................... 250/492 A; 250/442; 250/398
[58] Field of Search ............... 250/442, 491, 456, 400, 250/492 A, 397

[56] References Cited

U.S. PATENT DOCUMENTS

| 3,648,048 | 3/1972 | Cahan et al. | 250/442 |
| 3,699,334 | 10/1972 | Cohen et al. | 250/492 A |
| 3,900,737 | 8/1975 | Collier et al. | 250/492 A |
| 3,903,486 | 9/1975 | Bert et al. | 250/492 A |

Primary Examiner—Alfred E. Smith
Assistant Examiner—B. C. Anderson
Attorney, Agent, or Firm—Oblon, Fisher, Spivak, McClelland & Maier

[57] ABSTRACT

A radiant beam exposure apparatus forms a desired pattern on a workpiece disposed on a carriage movable in both directions X and Y which intersect at a right angle. The distance over which the carriage moves is measured by a laser interferometer. In response to the output of the interferometer, a pulse generating circuit generates one pulse for each $n/m$ wavelength of laser light. The pulse signal is supplied from the pulse generating circuit to a memory device storing information corresponding to the pattern and at the same time to a deflection signal generator. Upon receipt of the pulse signal, the memory device reads out the information, and the deflection signal generator generates a deflection signal. The information signal is supplied from the memory device to a blanking signal generator. In response to the information signal, the blanking signal generator generates a blanking signal, which is supplied together with the deflection signal to a radiant beam scanning device, thereby forming the desired pattern on the workpiece.

18 Claims, 7 Drawing Figures

FIG. 3A
|    | 1 | 2 | 3 | 4 | 5 | 6 | 7 | 8 |
|----|---|---|---|---|---|---|---|---|
| 1  | 0 | 1 | 1 | 0 | 0 | 0 | 0 | 0 |
| 2  | 0 | 0 | 0 | 0 | 0 | 0 | 0 | 0 |
| 3  | 0 | 0 | 0 | 0 | 0 | 0 | 0 | 0 |
| 4  | 0 | 0 | 0 | 0 | 0 | 0 | 0 | 0 |
| 5  | 0 | 0 | 0 | 0 | 0 | 0 | 0 | 0 |
| 6  | 0 | 0 | 0 | 0 | 0 | 0 | 0 | 0 |
| 7  | 0 | 0 | 0 | 0 | 0 | 1 | 1 | 1 |
| 8  | 1 | 1 | 1 | 1 | 1 | 1 | 1 | 1 |
| 9  | 1 | 1 | 1 | 1 | 1 | 1 | 1 | 1 |
| 10 | 1 | 1 | 1 | 1 | 1 | 1 | 0 | 0 |
| 11 | 0 | 0 | 0 | 0 | 0 | 0 | 0 | 0 |
| 12 | 0 | 0 | 0 | 0 | 0 | 0 | 0 | 0 |
| 13 | 0 | 0 | 0 | 0 | 0 | 0 | 0 | 1 |
| 14 | 1 | 1 | 1 | 1 | 1 | 1 | 1 | 1 |
| 15 | 1 | 1 | 1 | 1 | 1 | 1 | 1 | 1 |
| 16 | 1 | 1 | 1 | 1 | 1 | 1 | 1 | 1 |
| 1  | 0 | 0 | 1 | 0 | 0 | 0 | 0 | 0 |
| 2  | 0 | 0 | 0 | 0 | 0 | 0 | 0 | 0 |
| 3  | 0 | 0 | 0 | 0 | 0 | 0 | 0 | 0 |
| 4  | 0 | 0 | 0 | 0 | 1 | 1 | 1 | 1 |
| 5  | 1 | 1 | 1 | 1 | 1 | 1 | 1 | 1 |
| 6  | 1 | 1 | 1 | 1 | 1 | 1 | 1 | 1 |
| 7  | 1 | 1 | 1 | 1 | 1 | 1 | 1 | 1 |
| 8  | 1 | 1 | 1 | 1 | 1 | 1 | 1 | 1 |
| 9  | 1 | 1 | 1 | 1 | 1 | 1 | 1 | 1 |
| 10 | 1 | 1 | 1 | 1 | 1 | 1 | 0 | 0 |
| 11 | 0 | 0 | 0 | 0 | 0 | 0 | 0 | 0 |
| 12 | 0 | 0 | 0 | 0 | 0 | 0 | 0 | 0 |
| 13 | 0 | 0 | 0 | 0 | 0 | 0 | 0 | 0 |
| 14 | 0 | 0 | 0 | 0 | 0 | 0 | 0 | 0 |
| 15 | 0 | 0 | 0 | 0 | 0 | 0 | 0 | 0 |
| 16 | 0 | 0 | 0 | 1 | 1 | 1 | 1 | 1 |
FIG. 3B
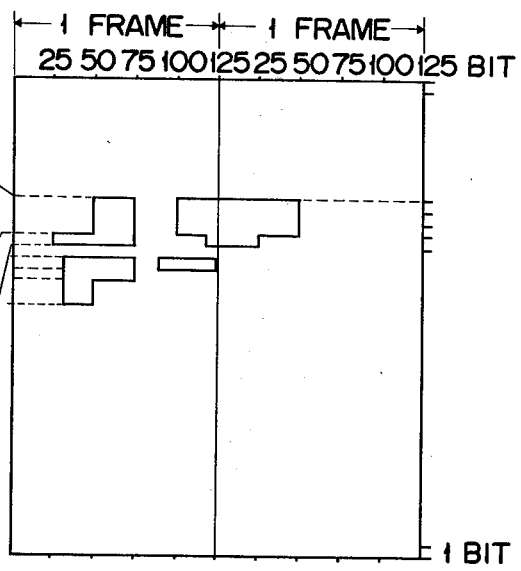
FIG. 4
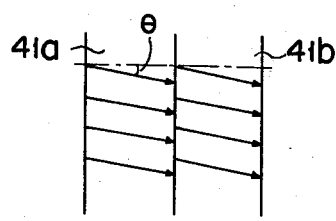

ELECTRON BEAM EXPOSURE APPARATUS

BACKGROUND OF THE INVENTION

This invention relates to a radiant beam exposure apparatus and particularly an electron beam exposure apparatus in which a workpiece is exposed to an electron beam controlled by a deflection signal and a blanking signal which has been generated in response to an information signal corresponding to a desired pattern.

In a prior art electron beam exposure apparatus a workpiece to be exposed is mounted on a workpiece supporting platform or a carriage and the projection of the electron beam is turned ON and OFF in synchronism with the deflection scanning of the beam so as to form a predetermined pattern on one block of the workpiece. Then, after moving the carriage one step the same produce step is repeated thereby forming a predetermined pattern on the entire surface of the workpiece.

The pattern to be finally obtained by the electron beam exposure apparatus of the type referred to above has a dimension of about 50 mm × 50 mm, for example. However, the area that can be efficiently scanned by the electron beam is less than several millimeter square so that in order to obtain a pattern having the desired area as above described it is necessary to join together a plurality of small scanning pattern blocks each having an area of several millimeter square.

Where the workpiece thus prepared is to be used as a mask for manufacturing a large scale integrated circuit the pattern should have an extremely high dimensional accuracy. The maximum permissible errer at such high accuracy is about 0.5 micron. In an electron beam scanning apparatus, the electron lens system utilized therein has an aberration which increases in proportion to two or three power of the number of patterns to be formed. For this reason, when one side of the block has, for example, a length of 5 mm, an errer of the order of 5 microns would be resulted causing it difficult to accurately join together respective blocks. Accordingly, the resulting pattern will be considerably deformed. In order to obtain a pattern having a dimension of 50 mm × 50 mm by assembling together a plurality of blocks each having a dimension of 0.5 mm × 0.5 mm it is necessary to join together $(50/0.5)^2$ or $10^4$ blocks. In this case, when a pattern of one block has been formed the carriage is moved 0.5 mm to the next scanning block, and it takes about one second for this shift. Accordingly, until all of $10^4$ blocks are formed it takes $10^4$ seconds, that is several hours. This greatly decreases the merit of using the electron beam designed for high speed exposure, hence the commercial value of the apparatus.

When forming a desired pattern on the workpiece by scanning an electron beam the accuracy of describing the pattern is not so high as the accuracy of the characteristic of the deflection current supplied to the scanning and deflection coils but it is extremely difficult to oscillate the electron beam at a frequency of several tens KHz and to control without any drift and at an accuracy of higher than $10^{-3}$ the current amplitude which varies from time to time. For this reason, it is desirable that the length of one side of each block should be less than 0.2 mm.

While in the conventional electron beam exposure apparatus the deflection and blanking control of the electron beam is effected in synchronism with a predetermined clock pulse, the carriage is driven by a servomechanism controlled in synchronism with the clock pulse. For this reason, for the purpose of synchronizing the moving speed of the carriage and the pattern forming speed or the beam scanning speed during the forming of a pattern by the electron beam the speed of the carriage is detected by a laser interferometer so as to correct the speed of the carriage by a signal detected by the interferometer.

In correcting the movement of the carriage it is necessary to correct not only the speed of the carriage but also the angular displacement thereof with reference to the movements in the direction of X and Y axes. Since such corrections should be made at high accuracies it is necessary to use highly accurate correction device for the carriage.

SUMMARY OF THE INVENTION

Accordingly it is an object of this invention to provide an improved radiant beam exposure apparatus which can decrease the exposure time of a radiant beam upon a workpiece mounted on a carriage and does not require an accurate mechanism for controlling the movement of the carriage.

Another object of this invention is to provide a novel radiant beam exposure apparatus capable of forming patterns of various types on the workpiece.

According to a preferred embodiment of this invention, the amount of movement of a movable carriage for supporting a workpiece to be exposed to a radiant beam, for example, an electron beam, is measured by a laser interferometer. The laser interferometer is coupled with a pulse converter which generates a pulse when the movable carriage is moved a distance equal to a predetermined fraction of the wavelength of the laser beam. A pulser is connected to the pulse converter for generating a pulse for a predetermined number of the output pulses from the pulse converter. The output from the pulser is used as a clock pulse for determining the exposure position on the workpiece and for controlling the start of the exposure operation of the electron beam. A pattern information corresponding to a predetermined exposure pattern is read out from a memory device in synchronism with the clock pulse under control of a program control device, and the pattern information is applied to a blanking signal generator for generating a blanking signal. The clock signal is also supplied to a deflection signal generator for generating a deflection signal. The deflection and blanking signals are applied to an electron beam generating device to control the radiant beam by which the workpiece is exposed at a column of frames the desired pattern. The radiant beam exposure is made successively from a first column of frames to a last column of frames to form a predetermined pattern on the entire surface of the workpiece.

BRIEF DESCRIPTION OF THE DRAWING

FIG. 3a shows a form of the pattern information items corresponding to one scanning line of the electron beam;

FIG. 3b is a diagram showing the pattern to be formed in the frames of the workpiece;

FIG. 4 is a graph showing the manner of shifting the electron beam;

DETAILED DESCRIPTION OF THE PREFERRED EMBODIEMNTS

Figure 1:
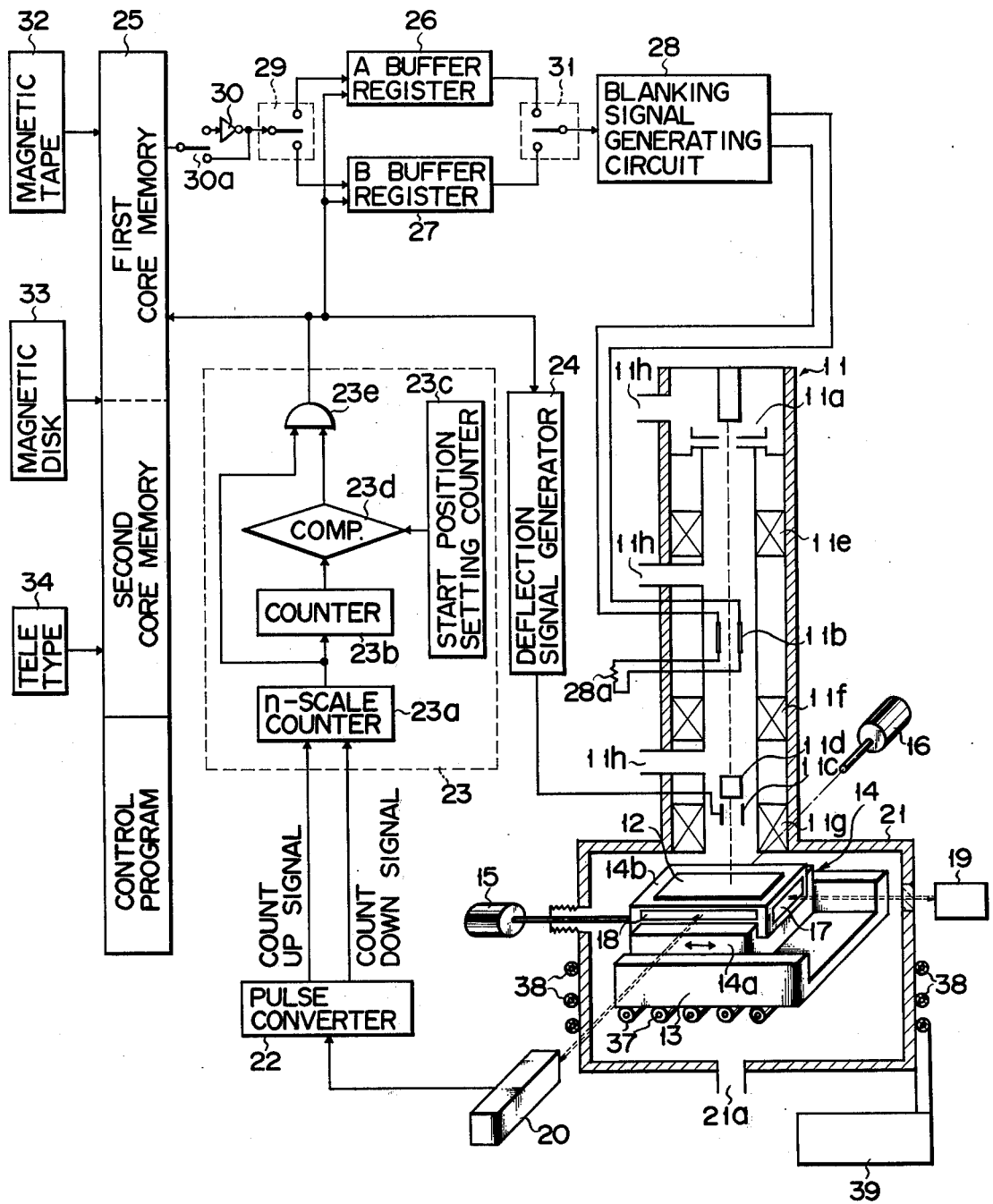
FIG. 1 is a block diagram, partly in longitudinal section, showing one embodiment of electron beam exposure apparatus embodying the invention.

In a prefered embodiment shown in FIG. 1, a radiant beam scanning device or an electron beam scanning device 11 is disposed to confront an object or a workpiece 12 to be exposed to a radiant beam, for example, an electron beam. The workpiece 12 is supported by a carriage 14 mounted on a base 13 to be movable in the X and Y directions and the carriage 14 comprises a movable member 14a driven by an electric motor 15 in the X direction and a second movable member 14b driven by an electric motor 16 in the Y direction. Mirrors 17 and 18 are secured to the end surfaces of the movable member 14b which intersect each other at right angles. Laser interferometers 19 and 20 are disposed to oppose mirrors 17 and 18, respectively. The electron beam scanning device 11 comprises an electron beam emitting gun 11a, blanking electrodes 11b, main deflection electrodes 11c, auxiliary deflection electrodes 11d, electromagnetic coils 11e and 11f constituting a condenser electron lens, and an electromagnetic coil 11g constituting an object lens, said electrodes and electromagnetic coils being contained in a housing 11i. The base 13 and the carriage 14 are contained in a casing 21 provided with an exhaust port 21a and integrally bonded to and communicated with the housing 11i of the electron beam scanning device 11. Although not shown, the casing 21 is provided with a pre-chamber for loading and unloading the workpiece.

The output from the laser interferometer 20 is applied to a pulser 23 via a pulse converter 22. Preferably, the interferometer 20 comprises a double beam type laser interferometer which is constructed to project a laser beam upon the mirror 18 for detecting the amount of movement of the movable member 14b by utilizing the Doppler effect of the beam reflected by the mirror 18. More particularly, each time the movable member 14b moves over a distance equal to $1/m$, for example, $\frac{1}{8}$, of the wavelength of the laser beam the pulse converter 22 produces a pulse with a time lag of less than 1 microsecond. The pulse converter generates an up or down count pulse signal in response to the fore and aft movements of the movable member 14b in the Y direction. The output pulse from the pulse converter 22 is applied to a multi-scale counter, for example, a 6-scale counter 23a which produces one pulse signal for 6 pulses from the pulse converter 22. Accordingly, the counter 23a produces an output each time the movable member 14b moves a distance equal to $\frac{1}{8}\lambda \times 6$ where $\lambda$ represents the wavelength of the laser beam. The reason that the period of the output pulse is selected to be equal to $6/8\lambda$ is that, where a helium-neon laser generating a laser beam having a wavelenth of 6328A is used for the interferometer, the $6328A \times (6/8 = 4746A$ is close to 0.5 micron. The pattern now being utilized to manufacture has a unit length of 0.5 or 1 micron. Moreover, even when the length of the pattern for integrated circuits is reduced several percent, substantially the same IC characteristics can be obtained. For this reason, any conventional pattern can be used in this invention. If the period of the laser pulse is shorter than $\frac{1}{8}\lambda$, then a value close to 0.5 micron can be obtained by selecting a suitable value other than 6/8. The number of the output pulses from counter 23a is counted by a counter 23b and the content thereof and the content of a start position setting counter 23c are compared by a comparator 23d, and the output thereof and that of the counter 23a are applied to the two inputs of an AND gate circuit 23e.

The output from the AND gate circuit 23e is supplied to a deflection signal generator 24, a mini-computer 25, an A buffer register 26 and a B buffer register 27. The output from the deflection signal generator 24 is applied to the deflection electrodes 11c. The inputs of the A and B buffer registers 26 and 27 are connected to the mini-computer 25 through a transfer switch 29 and an inverter 30, whereas the output from the A and B buffer registers are connected to the blanking signal generating circuit 28 via a transfer switch 31. The inverter 30 is connected to be selectively inserted or disconnected by a transfer switch 30a. The mini-computer 25 is coupled with a magnetic tape recorder 32 a magnetic disk recorder 33 and a teletypewriter 34.

The electron beam exposure apparatus described above operates as follows.

Figure 2:
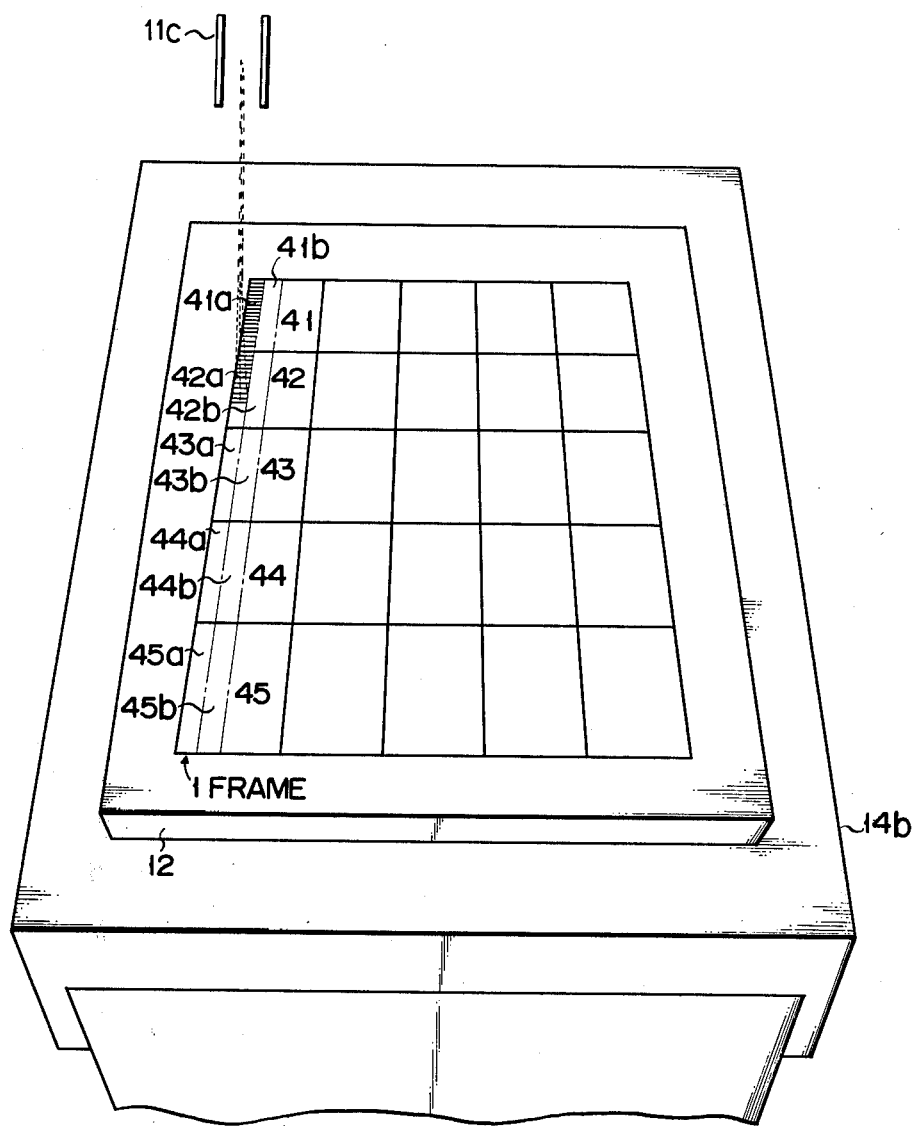
FIG. 2 is a perspective view of a workpiece or an object to be exposed useful to explain how patterns are formed on the workpiece.

In this embodiment, the workpiece to be exposed to the electron beam has a dimension of 9.4 × 9.2 mm and patterns are fomed on 25 chips arranged in 5 columns and 5 rows, as shown in FIG. 2. Although not shown the motors 15 and 16 are energized by the mini-computer 25 or other programming apparatus for moving the carriage 14 in the X and Y directions. The amount of movement of the carriage 14 is measured by the laser interferometers 19 and 20.

As the carriage 14 is moved in one direction, the interferometer 20, for example, produces an output which is converted by the pulse converter 22 into an up or down count pulse which is applied to the 6-scale counter 23a of the pulser 23. The 6-scale counter 23a produces one pulse for 6 output pulses from the pulse converter 22 and the output from the 6-scale counter 23a is counted by the counter 23b. The count of this counter is compared with a definite count of the start position setting counter 23c by comparator 23d. After the count of the counter 23b coincides with that of the start position setting counter 23c, comparator 23d produces an output. When this output is applied to the input of the AND gate circuit 23e concurrently with the output from the counter 23a, and AND gate circuit 23e is enabled to send out the pulse signal from the 6-scale counter 23a. At this time, the carriage 14 has been moved to such position that the front edge of the leftmost frame 41a of the chip 41 of the first column and the first row just oppose the electron gun 11a of the electron beam scanning device 11. Under these conditions, the deflection signal generator 24 produces a deflection signal in response to the pulse signal from the pulser 23 which is applied to the deflection electrodes 11c for deflecting the electron beam. At this time a binary information block consisting of 125 bits corresponding to a predetermined pattern that has been stored in the A buffer register 26 is applied to the blanking signal generating circuit 28 in synchronism with a clock pulse generated by pulser 23 whereby the blanking signal generating circuit 28 generates a blanking signal in accordance with the binary information, that is binary signal "1" or "0". This blanking signal has a voltage level of 40 volt or zero volt in corespondence with the binary signal "1". The blanking signal is supplied to the blanking electrodes 11b of the electron beam scanning device 11 for effecting the blanking control of the electron beam. In other words, the electron beam is ON-OFF controlled in accordance with the binary signal "1" and "0". Thus, the electron beam is scanned in the X direction along the leftmost frame of the chip of the workpiece on the first column and the first row by the blanking control and the deflection control described above. Such scanning is effected by the deflection signal supplied to the deflection electrode 11c from the deflection signal generator 24 and having a frequency of about 16 KHz for deflecting the electron beam at an amplitude of 118.65 microns. During this deflection, the carriage 14 is continuously moved in the Y direction by motor 16 at a speed of 7.5 mm/sec. This means that while the electron beam is scanned over a distance of 118.65 microns in the horizontal or X direction, the carriage 14 is moved in the Y direction over a distance less than 0.4746 microns.

In this manner, the leftmost frame 41a of chip 41 on the first column and first row is completely scanned and then the scanning of the leftmost frame 42a of the chip 42 on the first column second row is performed as the carriage 14 is continuously moved in the Y direction. The manner of forming a predetermined pattern on the workpiece 12 by an electron beam will be described in more detail as follows.

Thus, information blocks corresponding to the patterns to be formed on the respective leftmost frames (referred as a leftmost column of frames) of the chips 41 through 45 on the first column and the first to fifth rows are stored in the mini-computer 25 in the form of 8 bits, 16 bytes. These pattern information blocks are read out according to the control program of the mini-computer 25 and in response to the output pulse from the pulser 23. The read out pattern information block each in the form of 128 series bits are transferred to the A buffer register 26 via inverter 30a which is selectively inserted into the circuit by the operation of the transfer switch 30a and transfer switch 29. Each bit of the 128 series bit information block stored in the A buffer register 26 is transferred to the blanking signal genrating circuit 28 in response to the output pulse from the pulser 23. It is to be understood that the inverter 30 is inserted into the circuit when it is desired to invert while and black of the pattern to be formed.

It is now assumed that an information block in the form of 8 bits, 16 bytes binary signals as shown in FIG. 3a is stored in the A buffer register 26. With reference to the information items on the upper row, the first three bits represent an information showing the number of repeating of the information items of remaining 125 bits and indicating that three scanning lines have the same patterns form. Consequently, the A buffer register 21 supplies three times the same 125 bit information items to the blanking signal generating circuit 28 so that the electron beam subjected to the blanking control of the blanking signal generated by the blanking signal generating circuit forms the pattern at the portion of the frame corresponding to the three scanning lines on the workpiece 12. While a pattern corresponding to the information block stored in the A buffer register 26 is formed on the workpiece, a 128 bit information block corresponding to the next different information block, that is the information on lower stage as shown in FIG. 3a is transferred to the B buffer register 27 from the mini-computer 25 via the selectively inserted inverter 30 and the transfer switch 29. When the information block stored in the A buffer register 26 have been transferred to the blanking signal generating circuit 28 the transfer switch 31 is switched to connect the B buffer register 27 to the blanking signal generating circuit 28, thereby supplying the information block in the B buffer register 27 to the blanking signal generating circuit 28 with the result that a scanned pattern corresponding to the information block stored in the B buffer register 27, that is the information block shown in lower stage of FIG. 3a is formed on the workpiece 12. Concurrently therewith, the transfer switch 29 is switched to the A buffer register 26 to transfer the bit information block corresponding to the next scanning line to the A buffer register 21 from the first one of the first and second core memory devices, for example, provided for the mini-computer 25 via inverter 30 and transfer switch 29. By alternately switching the A and B buffer registers in this manner for transferring the information block, there is no time gap between adjacent scanning operations, thus assuring fast and accurate scanning operations.

While the leftmost frame 41a is being scanned in this manner, the information corresponding to the leftmost frame 42a read out of the magnetic disk memory device 33 and stored in the second core memory device are then transferred to the A and B buffer registers 26 and 27 from the second core memory device of the mini-computer in the same manner as above described. When the information block in the first core memory device have been read out, the information blocks in the second core memory device are read out and pattern information blocks corresponding to the frame 43a are transferred to the first core memory device from the magnetic disk memory device 33. In this manner, information block are alternately stored and read out of the magnetic disk memory device 33 and the first and second memory devices of the mini-computer 25 in the same manner as that of the A and B buffer registers 26 and 27.

In case when the frames 41a and 44a have the same pattern, the pattern information block in the first core memory device are repeatedly read out four times and then the pattern information blocks corresponding to frame 45a are transferred to the A and B buffer registers 26 and 27 from the second core memory device. Such read out and transfer of the information blocks from the disk can be accomplished by the same method of reading and writing of the A and B registers 26 and 27 from the core memory.

Upon completion of the scanning operation of the leftmost column of frames 41a and 45a of the chips 41 through 45 the carriage 14 is returned to the edge position of the leftmost frame 41a of chip 41 by the Y direction motor 16. At the same time, the X direction motor 15 is operated in accordance with a driving information from the mini-computer 25 for positioning the carriage 14 at the next leftmost frame 41b by moving the carriage 14 in the X direction by one pitch that is 118.65 microns to expose the next leftmost column of frames 41b to 45b. Alternatively, instead of returning the carriage to the edge of the frame 41a, the carriage may be moved one pitch in the X direction from the position of frame 45a thereby commencing the scanning operation from the rear edge of next leftmost frame 45b adjacent to the frame 45a.

As the next scanning frame is determined as above described the pattern information blocks corresponding thereto are transferred to the A and B buffer registers 26 and 27 and then to the blanking signal generating circuit 28 for accomplishing the blanking control of the electron beam.

After exposing the chips 41 through 45 on the first column in a form of a plurality of frame columns each consisting of five frames to form desired patterns, the chips on the second to the fifth columns are sequentially exposed thus forming a predetermined pattern over the entire region of the workpiece 12.

Figure 5:
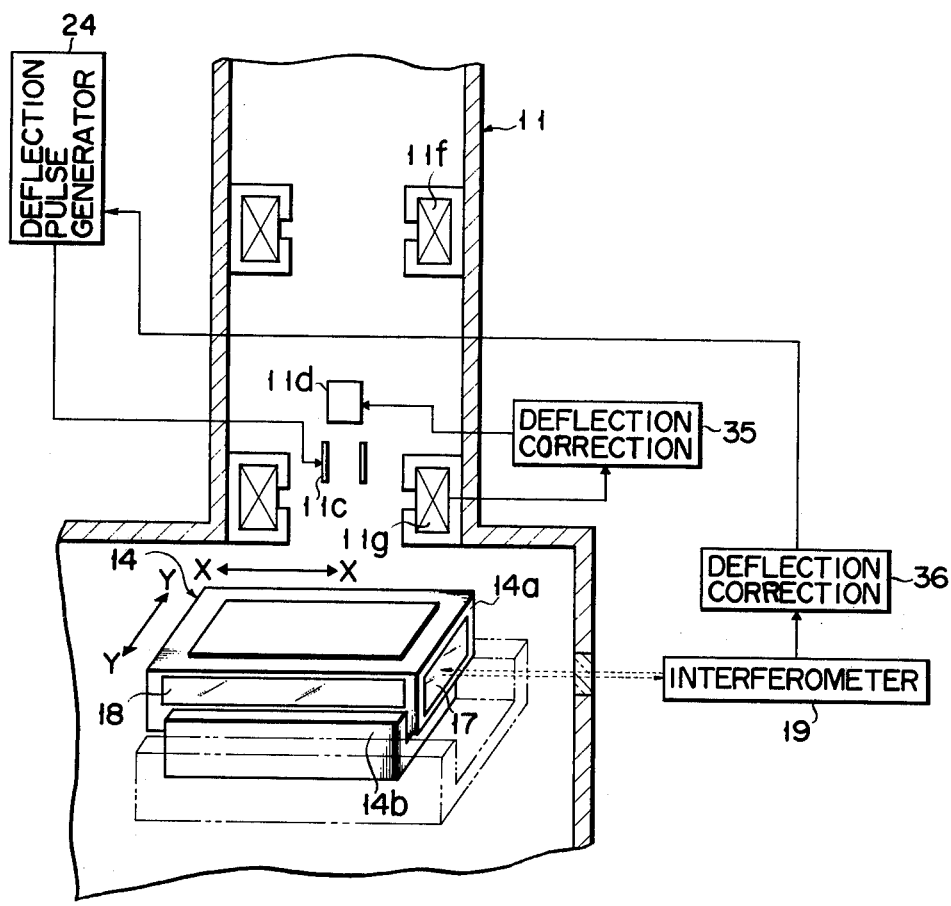
FIG. 5 shows the electrical connection between the correction circuit for the electron beam shift and the deflection electrodes.

Above description was made under the assumption that the scanning line of the electron beam does not rotate or shift in the direction of Y axis, actually however the scanning line slightly shifts in the direction of Y axis as shown in FIG. 4 so that the patterns formed on adjacent frames 41a and 41b, for example, formed by such shifted electron beam do not accurately coincide with slight offset at the joint. I have found that such offset is also caused by the increase in the current flowing through the condenser electron lens coil 11e and 11f and through the coil 11g constituting the object lens of the electron lens system, such increase being made for the purpose of increasing the current density of the electron beam. From our experiment I have found that the shift angle $\theta$ of the scanning beam is substantially proportional to the magnitude of the current flowing through the coil 11f constituting the object lens. Consequently as shown in FIG. 5, a correction circuit 35 is incorporated into the electron beam exposure apparatus of this invention for feeding back the varying component of the current flowing through the object lens coil 11f so as to correct the shift of the scanning beam. With this correction circuit the offset or shift of the patterns could be reduced to less than 0.05 micron from about 1 micron of the prior art apparatus. Instead of feeding back the current supplied to the object lens coil 11f it is also possible to use the current flowing through the condenser lens coil as the feedback current. Further, it is possible to measure the intensity of the magnetic field near the object lens by means of a Hall element for generating a feedback signal to the correction circuit. It is also possible to arrange a correction coil having a polarity opposite to that of the object lens coil 11f above or below the object lens coil 11f so as to compensate for the shift of the scanning beam.

In addition, in this invention, as shown in FIG. 5, a deflection correction circuit 36 is provided for compensating for that the frame pattern formed by the scanning beam is displaced by the transverse shift of the carriage 14 which occurs when the carriage is moved in the Y-direction. The compensating operation is effected by deflecting the electron beam in a manner following the rotating of the carriage. The correction circuit 36 is effective to compensate for the shift occuring when the carriage 14 is moved in the direction of X axis, and constructed to supply to the deflection pulse generator 24 a correction signal proportional to the variation in the output signal from the laser interferometer 19 utilized to detect the amount of movement of the carriage in the direction of X axis. The correction signal is used for controlling the level of the deflection signal in correspondence with the level of the correction signal. The correction circuit 36 is also constructed to compensate for the irregular movement of the carriage 14 caused by physical defect thereof when it is moved in the direction of Y axis. The main deflection electrodes 11c are constructed to be rotated by mechanical means, for example, a servo-mechanism, so as to establish a reference line for the direction of scanning at the start of the electron beam exposure apparatus.

Further, the illustrated embodiment is provided with pipes 37 and 38 passing water having a constant temperature for the purpose of maintaining the temperature of the carriage 14 and the interior of the exposure chamber at a constant value, thus obviating the adverse effect caused by the temperature variation. The water maintained at the constant temperature is supplied to the pipes 37 and 38 from a constant temperature device 39 the temperature fluctuation of which is within 0.05° to 0.1° C.

Figure 6:
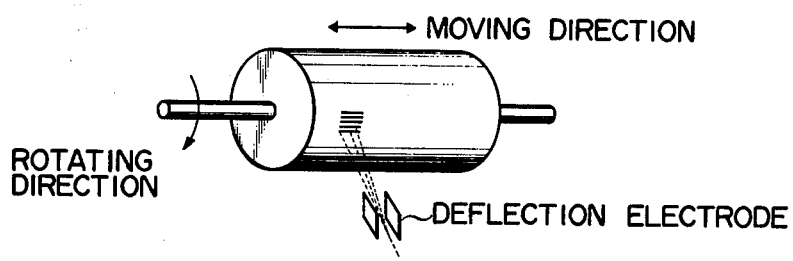
FIG. 6 is a perspective view showing a modified embodiment of this invention utilizing a drum instead of a carriage.

Instead of using a carriage movable on the X and Y directions a rotary drum wrapped with a photosensitive sheet and movable in the axial direction may be used as shown in FIG. 6 wherein the photosensitive shut is scanned by an electron beam in synchronism with the axial movement of the drum. This modification is more advantageous than the former embodiment utilizing a carriage movable in the X and Y directions in that it is possible to form patterns more stably and at higher accuracies.

Although in the foregoing embodiment, one bit was allocated for a picture element having one side equal to 6/8 wavelength of the laser light, the embodiment may be constructed to allocate one bit for a predetermined number of picture elements, whereby to decrease the number of bits for a definite pattern thus decreasing the required capacity of the information memory device.

Instead of using and electron beam, an ion beam, an X-ray beam or a light beam can also be used.

As has been described hereinabove, according to this invention, since the information of the pattern is divided into an integer multiple of the minimum unit $\lambda/m$, where $m$ is an integer, of the measurement it is possible to eliminate the conversion operation of the units and an extra circuit for such conversion. Since, conversion is not necessary, errors caused thereby would not be resulted. Thus for example, when selecting a $\lambda/8$ unit as the minimum measuring unit of the laser beam for the purpose of forming patterns at a uniform spacing, the patterns actually formed will have a uniform spacing. In contrast, according to the prior art method, even when the measurement is made at an equal spacing, the spacing between patterns actually formed will not be uniform. Where the minimum measuring unit of the laser beam $\lambda/m$ is extremely smaller than the pattern to be formed, there is no difficult problem. However, a problem occurres when the pattern is to be formed in regions having dimensions smaller than microns. Further, as the laser pulse produced at the time of moving the workpiece carriage is used as the time reference or clock pulse of the system, the movement of the carriage is not required to be absolutely constant. Where the pattern data are derived out from a computer and where the movement of the carriage is to be correlated with the derived out data, it is necessary to control the carriage by a servo-mechanisms at an accuracy of 10 microns for the displacement of 100 mm or an accuracy of $10^{-4}$. However, according to this invention, the error in the speed of movement of the carriage may be of the order of $10^{-1}$ to $10^{-2}$ As a result, it is not necessary to use a servo-control system, thus making it possible to use a synchronous motor. Moreover since the pattern information directly corresponds to the ON-OFF operation of the electron beam it is possible to increase the speed of reading out the information. If the switching between the ON and OFF operations is to be made in accordance with prescribed coordinates, it is necessary to install an operation circuit for converting the data into series data before the ON-OFF control operation. With the processing speed of a current mini-computer it is difficult to provide to the outside register an output for designating the switching point. It is one of the characteristics of this invention to use the first three bits among 128 bits as a control information designating the number (1 to 8) of the repeated uses of the remaining 125 bits, thus usually decreasing the number of pattern data to about one fourth thereof.

While in the foregoing description, $6/8\lambda$ of the wavelength 6328A of a helium-neon laser tube was used to provide a unit length close to 0.5 micron, if a unit length of $(13/16\lambda)$ were used, it would be possible to improve the accuracy. Where laser tubes other than the helium-neon type is used it is possible to obtain a suitable value of $n/m\lambda$.

As an offer to the computer, a so-called channel I/O interruption was used in the foregoing embodiments, but it is also possible to operate the computer by an external interruption or different type. The clock signal of the computer itself may be used as an external drive source for the purpose of synchronizing the operation of the computer with an external circuit. Although in the embodiment, the pattern information have been derived out to the outside through the CPU of the computer, it is also possible to derive out these information directly from the memory device, in which case the content of the memory device is read out in accordance with the request made by a fundamental pulse having a period of $(6/8)\lambda$. It will be clear that the laser wavelength unit can also be used for an optical exposure apparauts other than the electron beam exposure apparatus.

Moreover in the embodiment, Lecher wires 28a are provided, so that the blanking speed is less than 17 nsec.

What is claimed is:

1. A radiant beam exposure apparatus for forming a desired pattern on a workpiece by means of a radiant beam comprising
    a radiant beam gun for projecting a radiant beam onto the workpiece;
    a carriage for supporting the workpiece in the directions X and Y which intersect at a right angle;
    a carriage movement detector for detecting the movement of the carriage to generate a pulse signal which corresponds to the amount and speed of the carriage movement;
    a memory device for storing information corresponding to the desired pattern and for reading out the information in response to the pulse signal from the carriage movement detector;
    a blanking signal generator for generating, in response to the information read out from the memory device, a blanking signal which corresponds to the information;
    a blanking means for blanking the radiant beam in response to the blanking signal;
    a deflection signal generator for generating a deflection signal in responsive to the pulse signal from the carriage movement detector;
    deflection means for deflecting the radiant beam in response to the deflection signal from the deflection signal generator; and
    a thermostatic device for maintaining the carriage and the workpiece at a substantially constant temperature and having means for permitting flow of a liquid kept at a substantially constant temperature with a deviation of about 0.1° C.

2. A radiant beam exposure apparatus for forming a desired pattern on a workpiece by means of a radiant beam comprising
    a source of a radiant beam including a radiant beam gun for projecting a radiant beam onto the workpiece, blanking electrodes, deflection electrodes and an electron lens system;
    a carriage for supporting the workpiece and movable in directions X and Y which intersect at a right angle;
    a driving device for driving the carriage in the directions X and Y;
    a laser interferometer for measuring the amount of the carriage movement using a laser light so as to generate a pulse signal which corresponds to the amount and speed of the carriage movement;
    a control pulse generating circuit for producing one pulse for each $n/m$ wavelength of the laser light in response to the pulse signal, $m$ and $n$ being selected to have such value that $n/m$ wavelength of the laser light is substantially equal to a minimum length of the pattern;
    a program control device comprising a memory unit adapted to store information in the form of a binary signal corresponding to the desired pattern and to read out the pattern information in response to the pulse signal from the control pulse generating circuit;
    a blanking signal generator for generating, in response to the pattern information from the program control device, a blanking signal which corresponds to the pattern information, the blanking signal being supplied to the blanking electrodes for blanking the radiant beam; and
    a deflection signal generator for generating a deflection signal in response to the pulse signal from the control pulse generating circuit, the deflection signal being supplied to the deflection electrodes for deflecting the radiant beam.

3. The radiant beam exposure apparatus according to claim 2 wherein said program control device comprises a memory hierarchy for storing predetermined pattern information having a plurality of pattern information blocks each corresponding to one scanning of a radiant beam and at least two buffer registers respectively storing different pattern information blocks corresponding to one scanning of a radiant beam, said buffer registers being connected such that while the pattern information block in one buffer register is being read out according to the request of forming a predetermined pattern on a workpiece the different pattern information block corresponding to one scanning of the radiant beam is transferred from said memory hierarchy to the other buffer register and stored therein.

4. The radiant beam exposure apparatus according to claim 2 wherein the control pulse generating circuit generates one pulse signal each time the carriage moves a distance equal to 6/8 of the laser light wavelength.

5. The radiant beam exposure apparatus according to claim 3 wherein said memory hierachy comprises a magnetic disk memory device adapted to store all information in the form of binary bits corresponding to predtermined pattern to be formed on the entire regions of a workpiece, and a core memory device adapted to store the pattern information blocks corresponding to a pluraltiy of scanning lines and transferred from said magnetic disk memory device.

6. The radiant beam exposure apparatus according to claim 2 wherein said pulse generating circuit comprises a multi-scale counter adapted to count the number of output pulses from said interferometer for producing one pulse whenever it counts $m$ number of the pulses, and an additional counter for counting the number of output pulses from said multi-scale counter and for producing one pulse whenever it counts $n$ number of the pulses from the multi-scale counter, a start position setting counter for setting an exposure initiating position on said workpiece, a comparator circuit adapted to compare a predetermined number of counts of said start position setting counter and the number of counts of said additional counter for producing an output pulse when the number of counts of said additional counter exceeds the predetermined number of counts of said start position setting counter, and an AND gate circuit responsive to the output pulse from said multi-scale counter and the output pulse from said comparator circuit for passing the output pulse from said multi-scale counter.

7. The radiant beam exposure apparatus according to claim 2 wherein said movable carriage is moved by said driving means in the Y direction while the workpiece is being scanned and exposed by the radiant beam from a source thereof, and moved in the X direction over a distance equal to the width of scanning upon completion of the exposure in the Y direction having the width of scanning.

8. The radiant beam exposure apparatus according to claim 7 wherein said movable carriage is moved in the X direction over a distance equal to the width of scanning after it is returned to the original position.

9. The radiant beam exposure apparatus according to claim 7 wherein said movable carriage is moved in the X direction over a distance equal to the width of scanning upon completion of the exposure in the Y direction and then in the reversed Y direction to the preceeding exposure in the Y direction.

10. The radiant beam exposure apparatus according to claim 2 wherein said deflection electrodes are mounted to be movable with reference to the movable carriage for correcting the rotation deviation of the scanning line of the electron beam.

11. The radiant beam exposure apparatus according to claim 2 wherein said electron lens system comprises an object electron lens constituted by an electromagnetic coil energized by a focusing current, and said exposure apparatus further comprising auxiliary deflection electrodes and a main correction circuit responsive to the feedback current from said coil for producing a correction supplied to said auxiliary deflection electrodes for correcting the shift of the electron beam caused by said electron lens system.

12. The radiant beam exposure apparatus according to claim 2 further comprising means for detecting shift of said movable carriage from the X direction when the carriage is moved in this direction for producing a shift signal and an auxiliary correction circuit for applying said shift signal to said deflection electrodes for shifting the electron beam thereby compensating for said shift of the movable carriage.

13. The working beam exposure apparatus according to claim 2 wherein said blanking electrodes are coupled to said blanking signal generator via Lecher wires and terminated with Lecher wires.

14. The radiant beam exposure apparatus according to claim 2 wherein said movable carriage is contained in an exposure housing, said movable carriage and said exposure housing are provided with a thermostatic device including means for permitting a flow of a liquid kept at a substantially constant temperature with a deviation of about 0.1° C.

15. The radiant beam exposure apparatus according to claim 3 wherein each one of said buffer registers includes a region for storing bit pattern information block corresponding to the scanning line, and a region for storing information which represent the number of read outs of said bits pattern information.

16. The radiant beam exposure apparatus according to claim 2 which further includes means for detection the transverse displacement of said movable carriage for producing a signal when said movable carriage is moved in the Y direction and a correction signal for applying said signal to said main deflection electrode.

17. The radiant beam exposure apparatus according to claim 2 wherein said source of radiant beam generates an electron beam.

18. The radiant beam exposure apparatus according to claim 2 which exposes a plurality of frames of a workpiece each formed of a plurality of scanning lines and in which the program control device comprises a disk memory device adapted to store a plurality of information block groups each corresponding to one frame and having a plurality of information blocks each of which corresponds to one scanning line, at least two core memory devices for storing the pattern information block groups corresponding to different frames, respectively, and a mini-computer for controlling the transfer of the information block group so that the pattern information block group read out from the disk memory device is stored in a vacant one of the core memory devices while the information block group in the other core memory device is read out.

* * * * *